US006200846B1

(12) United States Patent
Watanabe

(10) Patent No.: US 6,200,846 B1
(45) Date of Patent: Mar. 13, 2001

(54) SEMICONDUCTOR DEVICE WITH CAPACITOR FORMED ON SUBSTRATE AND ITS MANUFACTURE METHOD

(75) Inventor: Akiyoshi Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/211,046

(22) Filed: Dec. 15, 1998

(30) Foreign Application Priority Data

Apr. 16, 1998 (JP) .................................................. 10-106623

(51) Int. Cl.[7] .................................................... H01L 29/76
(52) U.S. Cl. ........................ 438/239; 438/240; 438/250; 438/251; 438/254; 438/393; 438/397
(58) Field of Search ..................................... 438/238, 239, 438/240, 250, 397, 253, 254, 393, 396; 257/296

(56) References Cited

U.S. PATENT DOCUMENTS 5,005,103 * 4/1991 Kwon et al. ......................... 257/296
5,356,826 * 10/1994 Natsume ............................... 438/238
5,618,749 * 4/1997 Takahashi et al. ................... 438/238

* cited by examiner

Primary Examiner—J. Carroll
(74) Attorney, Agent, or Firm—Armstrong, Westerman, Hattori, McLeland & Naughton, LLP

(57) ABSTRACT

A first silicon film is deposited on a semiconductor substrate. A capacitor dielectric film is deposited on the first silicon film. A second silicon film is deposited on the capacitor dielectric film. The second silicon film is patterned to leave an upper electrode made of the second silicon film above an insulating surface of the semiconductor substrate. A first insulating film is deposited on the upper electrode and the capacitor dielectric film. A lamination structure of the first insulating film and the capacitor dielectric film is anisotropically etched to leave a spacer insulating film made of the first insulating film on the side walls of the upper electrode and to leave a portion of the capacitor dielectric film under the upper electrode and the spacer insulating film. The first silicon film is patterned to leave a lower electrode made of the first silicon film in an area inclusive of the upper electrode and the spacer insulating film.

5 Claims, 6 Drawing Sheets

SEMICONDUCTOR DEVICE WITH CAPACITOR FORMED ON SUBSTRATE AND ITS MANUFACTURE METHOD

This application is based on Japanese Patent Application No. 10-106623 filed on Apr. 16, 1998, the entire contents of which are incorporated herein by reference.

BACKGROUND OF THE INVENTION a) Field of the Invention

The present invention relates to a semiconductor device and its manufacture method, and more particularly to a semiconductor device formed with MISFETs and capacitors and its manufacture method.

b) Description of the Related Art

A conventional method of manufacturing a semiconductor device having capacitors and MISFETs will be described with reference to FIGS. 5A to 5C and FIGS. 6A and 6B.

As shown in FIG. 5A, an n-type well 102 is formed in a partial region of a surface layer of a p-type silicon substrate 100. A field oxide film 101 is formed on the surface of the silicon substrate 100 to define the region where the n-type well 102 was formed and an active region in the p-type surface layer of the silicon substrate 100. The surface layer in the active region is thermally oxidized to form a gate insulating film.

A first polysilicon film 103 is deposited on the field oxide film 101, this film 103 being doped with impurities to impart an n-type conductivity. A capacitor dielectric film 104 made of $SiO_2$ is deposited on the first polysilicon film 103. A second polysilicon layer 105 is deposited on the capacitor dielectric film 104, this film 105 being doped with impurities to impart the n-type conductivity.

Of the surface of the second polysilicon film 105, a partial area above the field oxide film 101 is covered with a resist pattern 110. By using the resist pattern 110 as a mask, the second polysilicon film 105 is etched. Thereafter, the resist pattern 110 is removed.

As shown in FIG. 5B, an upper electrode 105a made of the second polysilicon film 105 is being left.

As shown in FIG. 5C, an SiN film 106 is deposited on the capacitor dielectric film 104 and upper electrode 105a. Of the surface of the SiN film 106, a partial area inclusive of the area above the upper electrode 105a is covered with a resist pattern 111. By using the resist pattern 111 as a mask, the SiN film 106 and capacitor dielectric film 104 are etched. Thereafter, the resist pattern 111 is removed.

As shown in FIG. 6A, an SiN film 106 covering the upper electrode 105a and a capacitor dielectric film 104a under the SiN film 106 are being left. Of the surface of the first polysilicon film 103, the areas where gate electrodes are to be formed are covered with resist patterns 108. By using the resist patterns 108 and SiN film 106a as a mask, the first polysilicon film 103 is etched. Thereafter, the resist patterns 108 are removed.

As shown in FIG. 6B, gate electrodes 103b and 103c are being left on the gate insulating film on the active regions. A lower electrode 103a made of the first polysilicon film 103 is being left under the SiN film 106a. With the above processes, a capacitor 109 is formed having the lower electrode 103a, capacitor dielectric film 104a, and upper electrode 105a.

A p-channel MISFET and an n-channel MISFET are formed respectively in the n-type well 102 and p-type active region through ordinary MISFET manufacture processes.

With the method described with reference to FIGS. 5A to 5C and FIGS. 6A and 6B, two photolithography processes are required to form the capacitor 109, by using the resist pattern 110 for the upper electrode shown in FIG. 5A and the resist pattern 111 for the lower electrode shown in FIG. 5C. These two photolithography processes are required in addition to the MISFET manufacture processes.

Another method proposed heretofore forms the capacitor lower electrode and gate electrode by one photolithography process after the upper electrode and capacitor dielectric film 104 are formed through selective etching using the resist pattern 110 shown in FIG. 5A. With this method, the capacitor can be formed by adding one photolithography process. However, the side wall of the upper electrode of the capacitor and the upper surface of the lower electrode are separated only via the side wall of the capacitor dielectric film. A lowered breakdown voltage or an increased leak current of the capacitor become easy to occur.

SUMMARY OF THE INVENTION

It is an object of the present invention to provide a semiconductor device manufacture method capable of suppressing an increase in the number of photolithography processes and forming a capacitor of high reliability.

It is an object of the present invention to provide a semiconductor device capable of suppressing an increase in the number of photolithography processes and forming a capacitor of high reliability.

According to one aspect of the present invention, there is provided a method of manufacturing a semiconductor device comprising the steps of: depositing a first silicon film on a semiconductor substrate exposing insulating material on a partial surface of the semiconductor substrate; forming a capacitor dielectric film on the first silicon film; forming a second silicon film on the capacitor dielectric film; patterning the second silicon film to leave an upper electrode made of the second silicon film above the partial surface exposing the insulating material; depositing a first insulating film on the upper electrode and the capacitor dielectric film; anisotropically etching a lamination structure of the first insulating film and the capacitor dielectric film, to leave a spacer insulating film made of the first insulating film on side walls of the upper electrode and to leave a portion of the capacitor dielectric film under the upper electrode and the spacer insulating film; and patterning the first silicon film to leave a lower electrode made of the first silicon film in an area inclusive of the upper electrode and the spacer insulating film.

When the capacitor dielectric film is anisotropically etched, the upper surface of the upper electrode and the upper surface of the first silicon film are separated by the side wall surface of the first spacer insulating film. Leak current between the upper electrode and the first silicon film can therefore be suppressed. The first silicon film under the capacitor dielectric film is a capacitor lower electrode. Leak current between the upper and lower electrodes can be prevented from being increased.

The first and second silicon films may be other conductive films not using silicon.

According to another aspect of the present invention, there is provided a semiconductor device comprising: a semiconductor substrate having an insulating surface; a lower electrode disposed on a partial area of the insulating surface of the semiconductor substrate; a capacitor dielectric film disposed on a partial area of an upper surface of the lower electrode and made of high dielectric material or paraelectric material; an upper electrode disposed in a partial area of an upper surface of the capacitor dielectric film; and a spacer insulating film made of a same material as the capacitor dielectric film, the spacer insulating film covering the upper surface of the capacitor dielectric film not covered with the upper electrode and side walls of the upper electrode.

The upper surface of the upper electrode is separated from the upper surface of the lower electrode by the side wall surface of the spacer insulating film. Leak current between the upper and lower electrodes can therefore be suppressed.

According to another aspect of the present invention, there is provided a method of manufacturing a semiconductor device comprising the steps of: forming element isolation structures on a surface of a semiconductor substrate to define active regions for MISFETs; forming a gate insulating film on surfaces of the active regions; depositing a first conductive film on the element isolation structures and the gate insulating film; forming a capacitor dielectric film on the first conductive film; depositing a second conductive film on the capacitor dielectric film; patterning the second conductive film to leave an upper electrode made of the second conductive film above a partial area of the element isolation structure; depositing a first insulating film covering the upper electrode and the capacitor dielectric film; anisotropically etching the first insulating film to leave a first spacer insulating film on side walls of the upper electrode; removing the capacitor dielectric film in an area not covered with the upper electrode and the first spacer insulating film to expose the first conductive film; forming a first mask pattern on a surface of the first conductive film, the first mask pattern covering an area inclusive of an area where the upper electrode and the first spacer insulating film were formed and areas in the active regions where gate electrodes of the MISFETs are to be formed; and etching the first conductive film by using the first mask pattern as a mask, to leave a lower electrode made of the first conductive film under the upper electrode and to leave gate electrodes made of the first conductive film on the active regions.

Both the lower electrode and gate electrode are formed by using the first mask pattern. The number of photolithography processes can be prevented from being increased.

The first and second silicon films may be other conductive films not using silicon.

According to another aspect of the present invention, there is provided a semiconductor device comprising: a semiconductor substrate; element isolation structures formed on a surface of the semiconductor substrate for defining active regions; MISFETs formed in the active regions, each MISFET having a source region, a drain region, and a gate electrode formed on a gate insulating film in an area between the source region and the drain region; a lower electrode disposed on each of the element isolation structures, made of a same layer as the gate electrode, and having generally a same thickness as the gate electrode; a capacitor dielectric film disposed on a partial upper area of the lower electrode; an upper electrode disposed on a partial upper area of the capacitor dielectric film; and a first spacer insulating film disposed on side walls of the upper electrode and made of insulating material, a side wall surface of the first spacer insulating film being smoothly continuous with a side wall surface of the capacitor dielectric film.

When the first spacer insulating film is left by anisotropic etching of the capacitor dielectric film and an insulating film, the side wall surface of the first spacer insulating film is smoothly continuous with the side wall surface of the capacitor dielectric film. Since the upper surface of the upper electrode and the upper surface of the lower electrode are separated by the first spacer insulating film, leak current between the upper and lower electrodes can be suppressed. If the lower electrode and gate electrode are formed by patterning a thin film formed by the same process, both the electrodes have the same material and the same thickness. If both the electrodes are formed by the same photolithography process, the number of photolithography processes can be prevented from being increased.

BRIEF DESCRIPTION OF THE DRAWINGS

FIGS. 5A to 5D and FIGS. 6A and 6B are cross sectional views of a substrate illustrating main processes of a conventional semiconductor device manufacture method.

DETAILED DESCRIPTION OF THE PREFERRED EMBODIMENTS

The first embodiment of the invention will be described with reference to FIGS. 1A to 1C and FIGS. 2A and 2B.

Figure 1A:
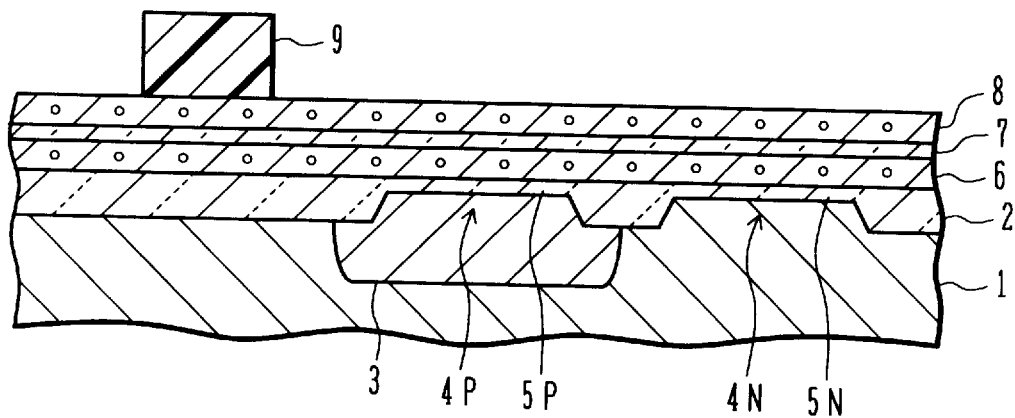
FIGS. 1A to 1C and FIGS. 2A and 2B are cross sectional views of a substrate illustrating main processes of a semiconductor device manufacture method according to a first embodiment of the present invention.

As shown in FIG. 1A, an n-type well 3 is formed in a partial region of a surface layer of a silicon substrate 1 doped with boron (B) impurities at $2\times10^{15}$ cm$^{-3}$ to impart a p-type conductivity. For example, the n-type well 3 is formed by implanting phosphorous (P) ions at an acceleration energy of 200 keV and a dose of $1.5\times10^{13}$ cm$^{-2}$.

Trench type element isolation structures 2 are formed in the surface layer of the silicon substrate 1. For example, the element isolation structure 2 is formed by forming a groove in an element isolation region, depositing an $SiO_2$ film over the whole substrate surface including the groove, and leaving the $SiO_2$ film only in the groove through chemical mechanical polishing (CMP). The element isolation structures 2 define an active region 4P in the n-type well 3 and an active region 4N in the p-type surface layer of the silicon substrate 1.

The surface layers of the active regions 4P and 4N are thermally oxidized to form gate insulating films 5P and 5N of about 5 nm in thickness respectively on the active regions 4P and 4N.

A first polysilicon film 6 having a thickness of 200 nm is formed on the element isolation structures 2 and gate insulating films 5P and 5N. For example, the first polysilicon film 6 is deposited through chemical vapor deposition (CVD) using $SiH_4$. Phosphorous (P) is diffused in the first polysilicon film 6 through gas phase diffusion to lower the electric resistance of the film 6. The sheet resistance of the first polysilicon layer 6 is set to 100 Ω/□, for example.

Instead of gas phase diffusion, solid phase diffusion, ion implantation or the like may be used, or P may be doped during the growth of the first polysilicon layer 6 by CVD. Instead of the first polysilicon film 6, an amorphous silicon film, a lamination of a silicon film and a metal silicide film, or a lamination of a silicon film and a refractory metal film may also be used.

A capacitor dielectric film 7 made of SiN and having a thickness of 30 nm is formed on the first polysilicon film 6.

For example, the capacitor dielectric film 7 is deposited by CVD using $SiH_4$ and $NH_3$. The material SiN of the capacitor dielectric film 7 may be replaced by $SiO_2$, SiON, paraelectric material, or high dielectric material.

A second polysilicon film 8 having a thickness of 200 nm is formed on the capacitor dielectric film 7. The second polysilicon film 8 may be formed by the same method used for the first polysilicon film 6. Similar to the first polysilicon film 6, instead of the second polysilicon film 8, an amorphous silicon film, a lamination of a silicon film and a metal silicide film, or a lamination of a silicon film and a refractory metal film may also be used.

Of the surface of the second polysilicon film 8, a partial area above the element isolation structure 2 is covered with a resist pattern 9. By using the resist pattern 9 as a mask, the second polysilicon film 8 is etched. For example, the second polysilicon film 8 is etched through dry etching using a mixed gas of chlorine ($Cl_2$) and oxygen ($O_2$). After the second polysilicon film 8 is etched, the resist pattern 9 is removed.

Figure 1B:
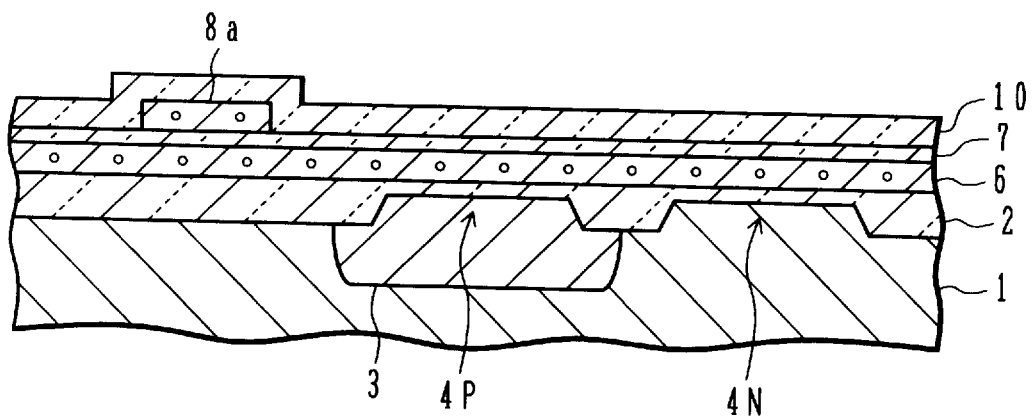

As shown in FIG. 1B, an upper electrode 8a made of the second polysilicon film 8 is being left on the partial area of the element isolation structure 2. A first insulating film 10 is deposited to a thickness of 250 nm, covering the upper electrode 8a and capacitor dielectric film 7. The first insulating film 10 is made of the same material as the capacitor dielectric film 7.

The first insulating film 10 and underlying capacitor dielectric film 7 are anisotropically etched by reactive ion etching (RIE) or the like. For example, this etching is performed by using a mixed gas of $CF_4$ and Ar as etching gas. Since the first insulating film 10 and capacitor dielectric film 7 are made of the same material, the two films can be etched in succession.

Figure 1C:
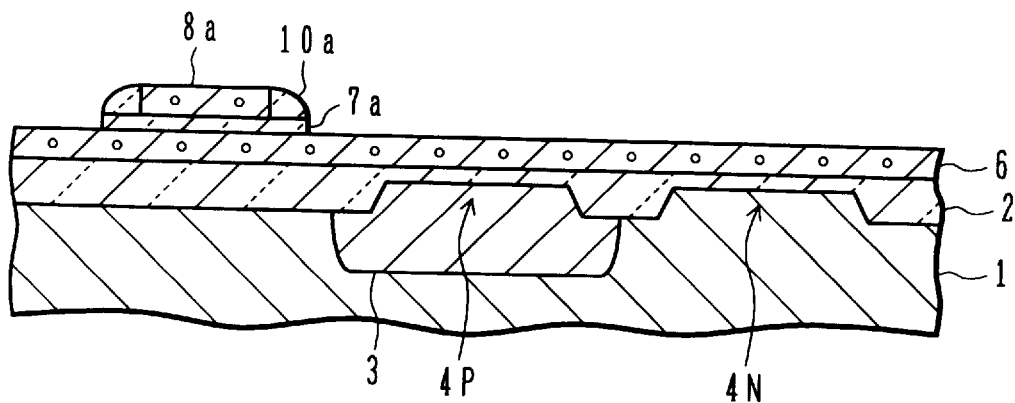

As shown in FIG. 1C, a first spacer insulating film 10a made of the first insulating film 10 is being left on the side wall of the upper electrode 8a. The capacitor dielectric film 7a is being left under the upper electrode 8a and first spacer insulating film 10a. Since the first insulating film 10 and capacitor dielectric film 7 made of the same material can be etched in succession under the same etching conditions, the side wall surface of the first spacer insulating film 10a becomes continuous with the side wall surface of the capacitor dielectric film 7a. In FIG. 1C, the first spacer insulating film 10a looks to be divided into two portions. Actually, the first spacer insulating film 10a surrounds the upper electrode 8a.

Figure 2A:
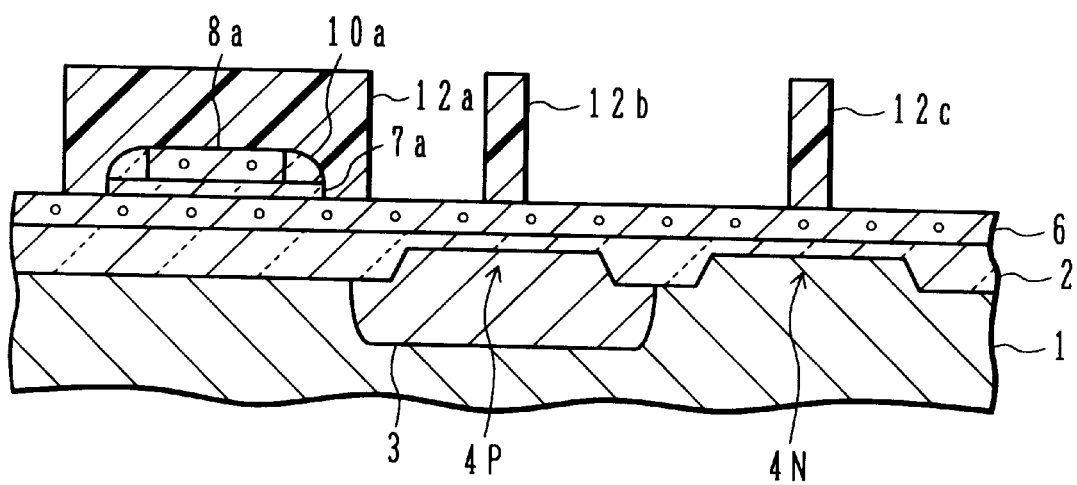

As shown in FIG. 2A, a resist pattern 12a is formed covering the surfaces of the upper electrode 8a, first spacer insulating film 10a, and nearby first polysilicon film 6. At the same time, resist patterns 12b and 12c are also formed covering gate electrode forming areas in the surface area of the first polysilicon film 6 on the active regions 4P and 4N.

By using the resist patterns 12a to 12c as a mask, the first polysilicon film 6 is etched. This etching is performed by the same method used for etching the second polysilicon film 8 described with reference to FIG. 1A. After the first polysilicon film 6 is etched, the resist patterns 12a to 12c are removed.

Figure 2B:
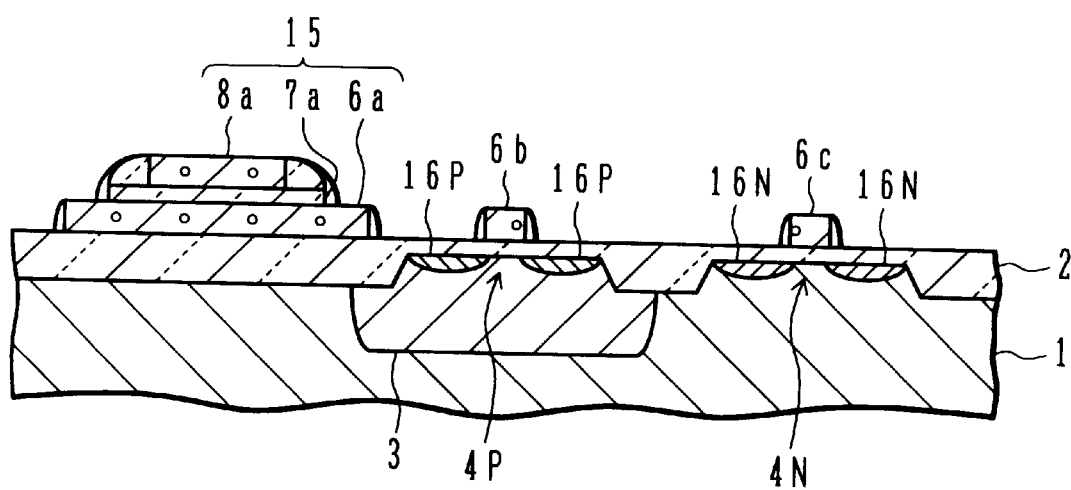

As shown in FIG. 2B, a lower electrode 6a made of the first polysilicon film 6 is being left under the capacitor dielectric film 7a. Gate electrodes 6b and 6c are also being left above the active regions 4P and 4N. With the above processes, a capacitor 15 is formed on the element isolation structure 2, having the lower electrode 6a, capacitor dielectric film 7a, and upper electrode 8a.

Thereafter, by using ordinary MISFET manufacture processes, a p-channel MISFET having the source/drain regions 16P and gate electrode 6b and an n-channel MISFET having source/drain regions 16N and gate electrode 6c are formed respectively in the active regions 4P and 4N.

In this embodiment, the capacitor lower electrode and MISFET gate electrodes are formed by the same photolithography process shown in FIG. 2A. Therefore, an increase in the number of photolithography processes required for forming a capacitor is only one process used for forming the upper electrode shown in FIG. 1A. In the state after the capacitor dielectric film 7a was formed as shown in FIG. 1C, the exposed surface of the upper electrode 8a is separated from the upper surface of the first polysilicon film 6 to be used as the lower electrode, via the side wall surface of the first spacer insulating film 10a and the side wall surface of the capacitor dielectric film 7a. It is therefore possible to prevent the manufacture yield and reliability from being lowered, which might be caused by leak current between the upper and lower electrodes 8a and 6a.

The first spacer insulating film 10a shown in FIG. 1C is formed by a process different from that of forming spacer insulating films on the side walls of the gate electrodes shown in FIG. 2B. It is therefore possible to determine the shape of the first insulating film 10a independently from the characteristics of MISFET.

Next, the second embodiment will be described with reference to FIGS. 3A to 3D and FIGS. 4A to 4C. The lamination structure up to the first insulating film 10 is formed by the same processes of FIGS. 1A and 1B of the first embodiment.

Figure 3A:
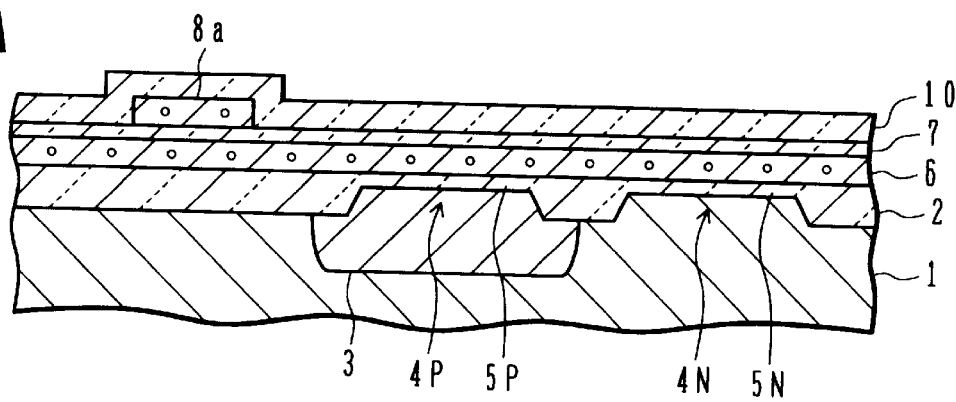
FIGS. 3A to 3D and FIGS. 4A to 4C are cross sectional views of a substrate illustrating main processes of a semiconductor device manufacture method according to a second embodiment of the present invention.

FIG. 3A shows the substrate structure same as that of the first embodiment shown in FIG. 1B. In the first embodiment, SiN is used illustratively as the material of the capacitor dielectric film 7 and first insulating film 10. In the second embodiment, $SiO_2$ is used. For example, the capacitor dielectric film 7 and first insulating film 10 are deposited by CVD using $SiH_4$ and $O_2$.

Figure 3B:
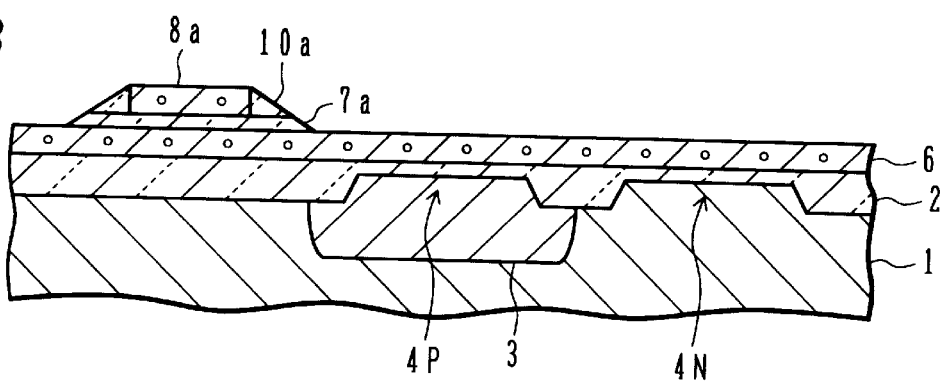

As shown in FIG. 3B, the first insulating film 10 and capacitor dielectric film 7 are anisotropically etched. This etching is performed under the condition that products for protecting steps on the substrate become easy to be formed, by lowering a supply power more than a supply power used for ordinary reactive ion etching for anisotropically etching a film to form a spacer insulating film on a side wall. For example, $CF_4$ at a gas flow of 50 sccm, $CHF_3$ at a gas flow of 50 sccm, and Ar at a gas flow of 1000 sccm are used as etching gas under the etching conditions of a pressure of 1500 mTorr and a supply power of about 400 W. Hydrogen atoms in $CHF_3$ are considered to contribute to the formation of products for protecting steps. Anisotropic etching under such conditions makes a gentle slope of the side wall surface of the first spacer insulating film 10a and capacitor dielectric film 7a.

Figure 3C:
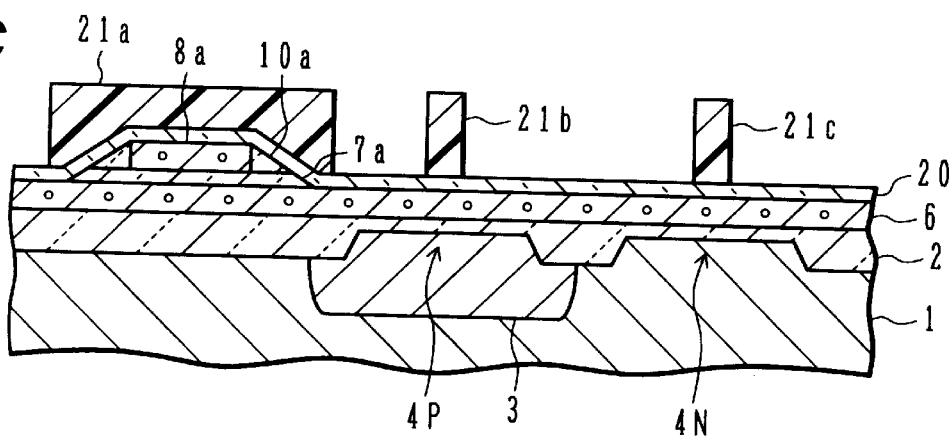

As shown in FIG. 3C, an anti-reflection film 20 of silicon nitride is deposited to a thickness of about 30 nm on the whole surface of the substrate. The anti-reflection film 20 is rich in Si and is used for a photolithography process with a KrF light source. As the anti-reflection film 20, a silicon oxynitride film rich in Si may be used.

A resist pattern 21a is formed on the surface of the anti-reflection film 20, covering the surfaces of a mesa structure and its nearby area. The mesa structure is constituted of the upper electrode 8a, first spacer insulating film 10a, and capacitor dielectric film 7a. At the same time, resist patterns 21b and 21c are also formed on the surface of the anti-reflection film 20, covering gate forming areas in the active regions 4P and 4N. Since the anti-reflection film 20 is formed, fine resist patterns can be formed with good reproductivity by using a KrF light source.

By using the resist patterns 21a to 21c as a mask, the anti-reflection film 20 and first polysilicon film 6 are etched. For example, the anti-reflection film 10 is etched through wet etching using hot phosphoric acid. The first polysilicon film 6 is etched by the same method used for etching the second polysilicon film 8 described at the process shown in FIG. 1A. After the first polysilicon film 6 is etched, the resist patterns 21a to 21c are removed.

Figure 3D:
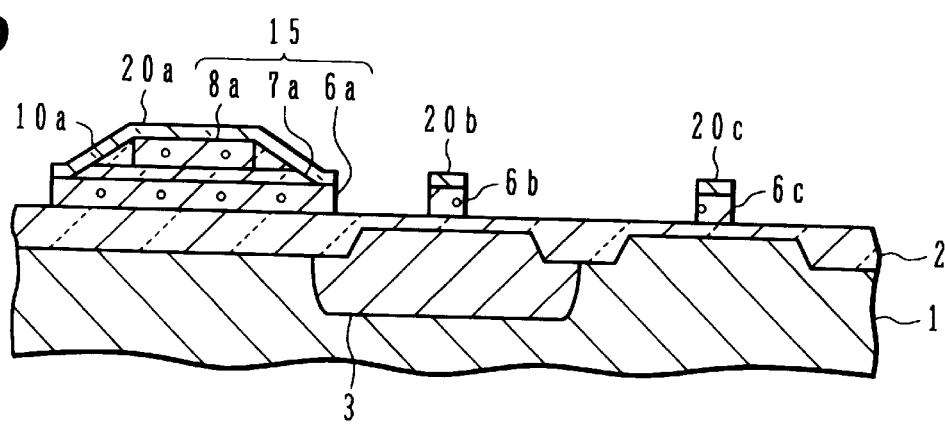

As shown in FIG. 3D, a lower electrode 6a made of the first polysilicon film 6 is being left under the capacitor dielectric film 7a, and gate electrodes 6b and 6c are being left in the active regions 4P and 4N. With the above processes, a capacitor 15 is formed on the element isolation structure 2, being constituted of the lower electrode 6a, capacitor dielectric film 7a, and upper electrode 8a.

Anti-reflection films 20a, 20b, and 20c are being left respectively on the upper surfaces of the capacitor 15 and gate electrodes 6b and 6c. In this state, ions are implanted into the surface layer of the semiconductor substrate 1 on both sides of each of the gate electrodes 6b and 6c in order to form low concentration regions of an lightly doped drain (LDD) structure. $BF_2$ ions are implanted on both sides of the gate electrode 6b under the conditions of an acceleration energy of 20 keV and a dose of $1\times10^{13}$ cm$^{-2}$, and P ions are implanted on both sides of the gate electrode 6c under the conditions of an acceleration energy of 20 keV and a dose of $5\times10^{13}$ cm$^{-2}$.

Figure 4A:
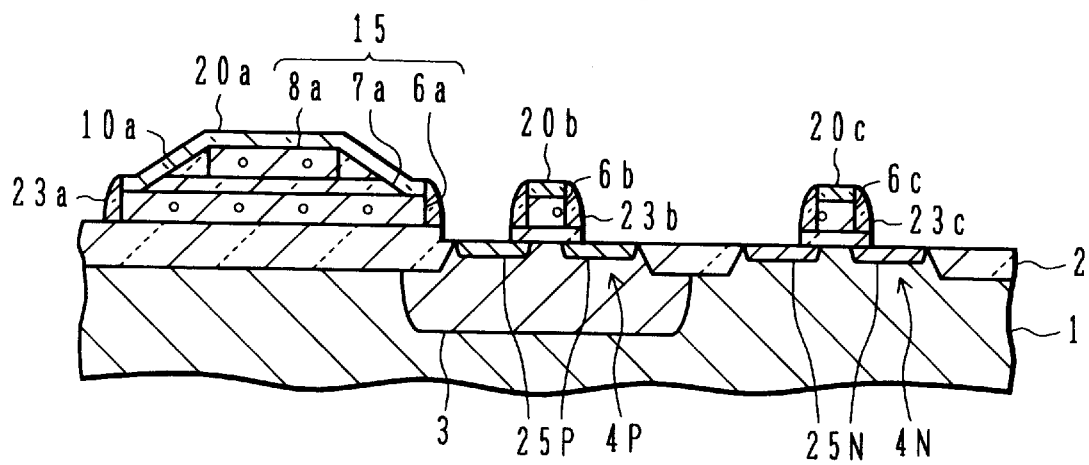

As shown in FIG. 4A, a p-type diffusion region 25P of a low concentration is being formed in a partial surface layer of the active region 4P, whereas an n-type diffusion region 25N of a low concentration is being formed in a partial surface layer of the active region 4N.

A second insulating film is formed over the surface of the semiconductor substrate 1 and anisotropically etched to leave second spacer insulating films 23b and 23c on side walls of the gate electrodes 6b and 6c. At this time, a spacer insulating film 23a is also left on the side wall of the lower electrode 6a. If the side wall surface of the first spacer insulating film 10a is steep, portion of the second insulating film becomes likely to be left above this steep surface.

In this embodiment, since the side wall surface of the first spacer insulating film 10a is a gentle slope surface, the second insulating film is prevented from being left above the gentle slope surface, if over etching of about 10 to 20% is performed. In order not to leave the second insulating film above the gentle slope surface, it is preferable that the maximum slope angle of the side wall surface of the first spacer insulating film 10a is smaller than 45° relative to the surface of the semiconductor substrate 1.

Ions are implanted in the surface layer of the semiconductor substrate 1 in order to form source/drain regions of a high concentration on both sides of each of two mesa structures, one being constituted of the gate electrode 6b and second spacer insulating film 23b and the other being constituted of the gate electrode 6c and second spacer insulating film 23c. $BF_2$ ions are implanted on both sides of the mesa structure including the gate electrode 6b under the conditions of an acceleration energy of 20 keV and a dose of $3\times10^{15}$ cm$^{-2}$, and arsenic ions are implanted on both sides of the mesa structure including the gate electrode 6c under the conditions of an acceleration energy of 30 keV and a dose of $1\times10^{15}$ cm$^{-2}$.

Figure 4B:
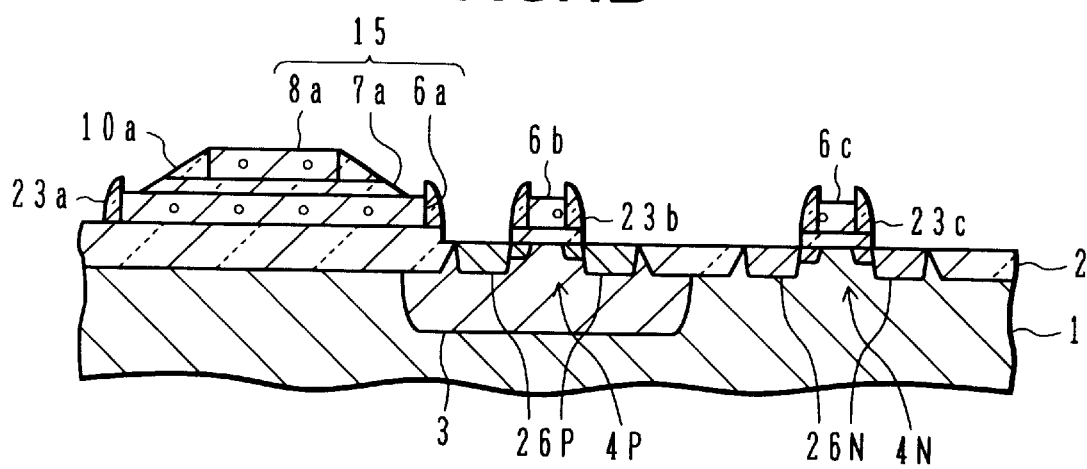

As shown in FIG. 4B, p-type source/drain regions 26P having an LDD structure are being formed in the substrate surface layer on both sides of the gate electrode 6b, whereas n-type source/drain regions are being formed in the substrate surface layer on both sides of the gate electrode 6c.

The anti-reflection films 20a to 20c left on the capacitor 15 and gate electrodes 6b and 6c are removed. For example, these anti-reflection films 20a to 20c are removed by using etchant containing hot phosphoric acid. As compared to a silicon nitride film formed by thermal CVD, a silicon nitride film optimized as an anti-reflection film for an excimer light source has very poor insulation. Therefore, if the anti-reflection film 20a is left on the slope surface of the first spacer insulating film 10a, this anti-reflection film 20a may lower a breakdown voltage between the upper and lower electrodes 8a and 6a or flow leak current therethrough.

In this embodiment, when the second spacer insulating films 23a to 23c shown in FIG. 4A are formed, an insulating film made of $SiO_2$ is not left above the slope surface of the first spacer insulating film 10a. Therefore, the anti-reflection film 20a on the first spacer insulating film 10a can be removed easily with hot phosphoric acid, and leak current can be prevented.

Figure 4C:
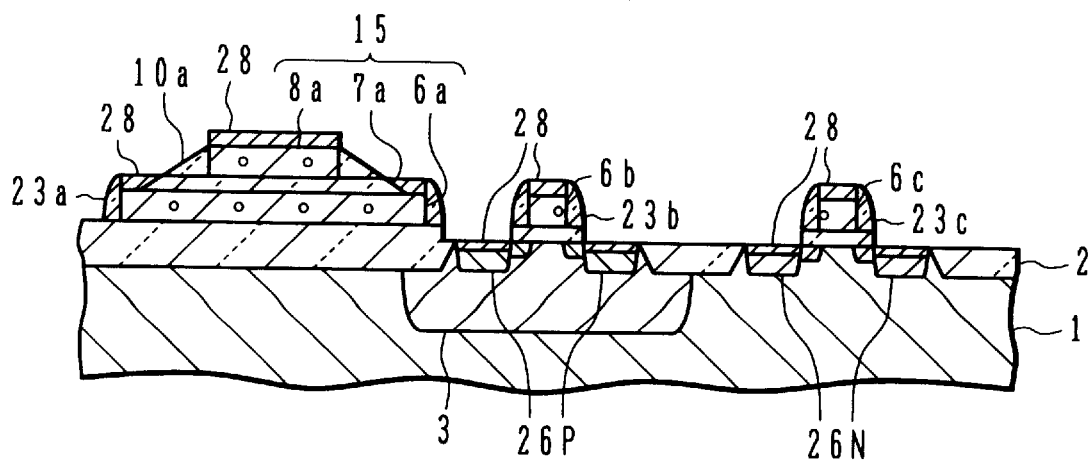
Figure 5A:
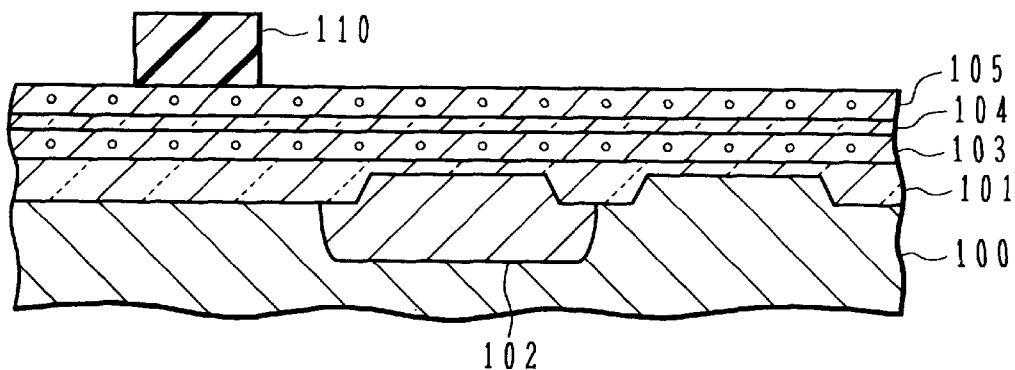
Figure 5B:
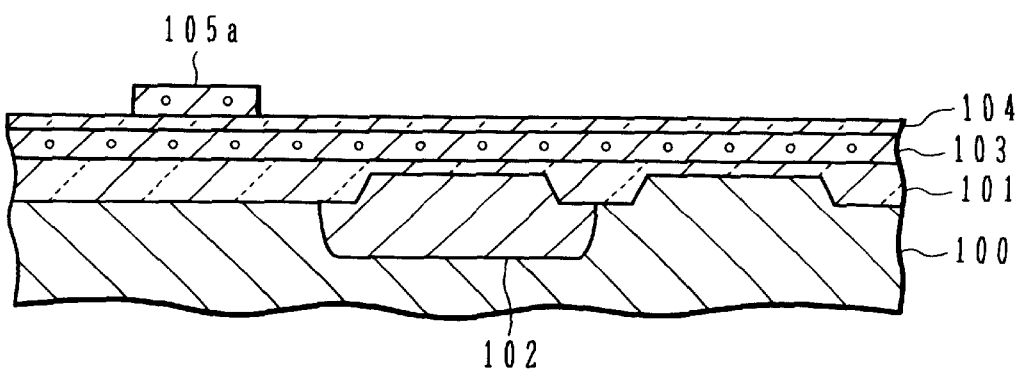
Figure 5C:
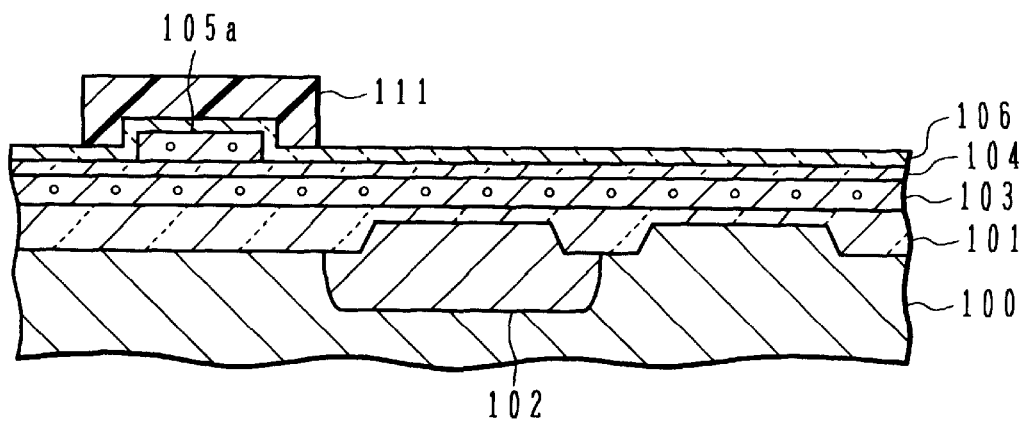
Figure 6A:
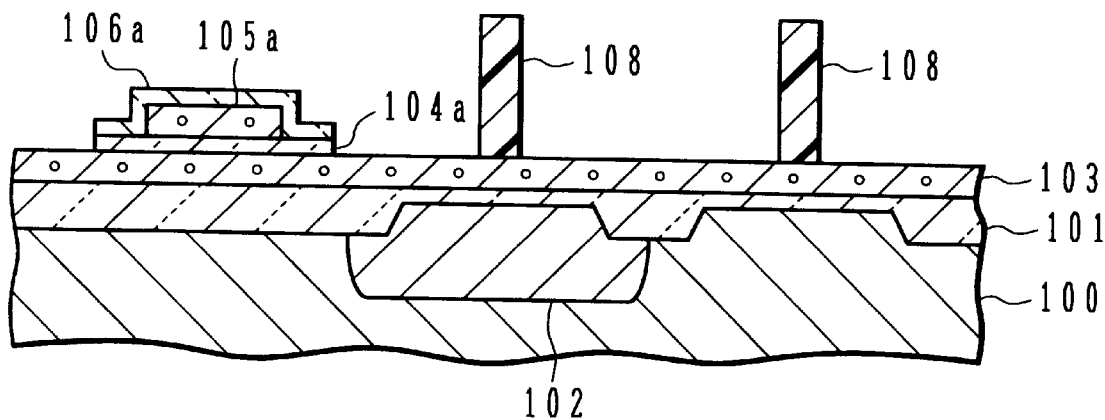
Figure 6B:
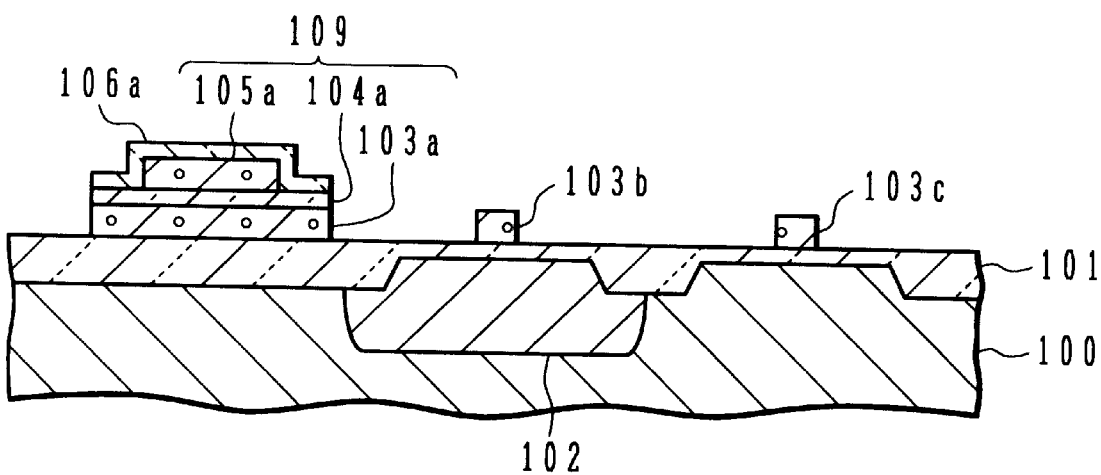

As shown in FIG. 4C, a low resistance film 28 of metal silicide is formed on the surfaces of the upper electrode 8a, lower electrode 6a, gate electrodes 6b and 6c, and source/drain regions 26P and 26N. A method of forming the low resistance film 28 will be described briefly.

First, the surface of the substrate is cleaned and a silicon oxide film formed on the substrate surface is removed, by using etchant containing hydrofluoric acid. A metal film is deposited on the surface of the substrate. The metal film is made of metal capable of forming a silicide compound by reacting with silicon, such as Co, Ti, Mo and Pt. For example, the metal film is deposited by sputtering a metal target of the above described material in an Ar atmosphere. The substrate is heated to enhance the silicification reaction of the metal film with the underlying silicon region. Thereafter, the unreacted metal film is removed. In this manner, the low resistance film 28 made of metal silicide can be formed on desired areas in a self-alignment manner.

In order to lower the step height on the substrate surface caused by the capacitor 15, it is preferable to thin the upper electrode 8a. As the upper electrode 8a is thinned, the space area between the upper and lower electrodes 8a and 6a, to be formed by the spacer insulating film on the side wall of the upper electrode 8a, is generally made narrow. In this embodiment, the first spacer insulting film 10a on the side wall of the upper electrode 8a can be formed wide by a process different from the process of forming the second spacer insulating films 23b and 23c on the side walls of the gate electrodes 6b and 6c. It is therefore possible to prevent a short circuit between the upper and lower electrodes 8a and 6a to be otherwise caused by a creep-up phenomenon of metal during the silicification reaction.

At the process shown in FIG. 4A, the second spacer insulating films 23a to 23c are formed before the anti-reflection films 20a to 20c are removed. It is therefore possible to prevent the interface of the MIS structure from being contaminated by hot phosphoric acid used at the process of removing the anti-reflection films 20a to 20c.

Similar to the first embodiment, also in the second embodiment, a capacitor can be formed by adding one photolithography process.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a semiconductor device comprising the steps of:

forming element isolation structures on a surface of a semiconductor substrate to define active regions for MISFETs;

forming a gate insulating film on surfaces of the active regions;

depositing a first conductive film on the element isolation structures and the gate insulating film;

forming a capacitor dielectric film on the first conductive film;

depositing a second conductive film on the capacitor dielectric film;

patterning the second conductive film to leave an upper electrode made of the second conductive film above a partial area of the element isolation structure;

depositing a first insulating film covering the upper electrode and the capacitor dielectric film;

anisotropically etching the first insulating film to leave a first spacer insulating film on side walls of the upper electrode;

removing the capacitor dielectric film in an area not covered with the upper electrode and the first spacer insulating film to expose the first conductive film;

forming a first mask pattern on a surface of the first conductive film, the first mask pattern covering an area inclusive of an area where the upper electrode and the first spacer insulating film were formed and areas in the active regions where gate electrodes of the MISFETs are to be formed; and etching the first conductive film by using the first mask pattern as a mask, to leave a lower electrode made of the first conductive film under the upper electrode and to leave gate electrodes made of the first conductive film on the active regions.

2. A method of manufacturing a semiconductor device according to claim 1, wherein the first conductive film and the second conductive film are made of silicon added with impurities to impart a conductivity.

3. A method of manufacturing a semiconductor device according to claim 1, wherein:

the capacitor dielectric film and the first insulating film are made of a same material; and at the step of anisotropically etching the first insulating film and at the step of removing the capacitor dielectric film, the first insulating film and the capacitor dielectric film are etched in succession.

4. A method of manufacturing a semiconductor device according to claim 1, further comprising the steps of:

implanting first ions in the active regions by using the gate electrodes on the active regions as a mask, after the step of etching the first conductive film;

depositing a second insulating film on the semiconductor substrate with the gate electrodes and the lower electrode;

anisotropically etching the second insulating film to leave second spacer insulating films on a side wall of the gate electrodes; and implanting second ions in the active regions by using the gate electrodes and the second spacer films as a mask, wherein the step of anisotropically etching the first insulating film is performed under a condition that a side wall surface of the first spacer insulating film has a gentle slope, so as not to leave the second insulating film on the first spacer insulating film at the step of anisotropically etching the second insulating film.

5. A method of manufacturing a semiconductor device according to claim 4, wherein at the step of anisotropically etching the first insulating film, the first insulating film is anisotropically etched under a condition that a maximum slope angle of the side wall surface of the first spacer insulating film is smaller than 45°.

* * * * *